United States Patent
Zhang

(10) Patent No.: US 8,921,991 B2
(45) Date of Patent: Dec. 30, 2014

(54) DISCRETE THREE-DIMENSIONAL MEMORY

(75) Inventor: Guobiao Zhang, Corvallis, OR (US)

(73) Assignees: ChengDu HaiCun IP Technology LLC, ChengDu, SiChuan (CN); Guobiao Zhang, Corvallis, OR (US)

( * ) Notice: Subject to any disclaimer, the term of this patent is extended or adjusted under 35 U.S.C. 154(b) by 0 days.

(21) Appl. No.: 13/591,257

(22) Filed: Aug. 22, 2012

(65) Prior Publication Data

US 2013/0056881 A1   Mar. 7, 2013

Related U.S. Application Data

(60) Provisional application No. 61/529,929, filed on Sep. 1, 2011.

(51) Int. Cl.
| | |
|---|---|
| *H01L 23/02* | (2006.01) |
| *G11C 5/02* | (2006.01) |
| *H01L 25/065* | (2006.01) |
| *H01L 25/10* | (2006.01) |
| *H01L 25/18* | (2006.01) |

(52) U.S. Cl.
CPC .............. *G11C 5/02* (2013.01); *H01L 25/0657* (2013.01); *H01L 25/105* (2013.01); *H01L 25/18* (2013.01); *H01L 2224/32145* (2013.01); *H01L 2224/32225* (2013.01); *H01L 2224/48145* (2013.01); *H01L 2224/48227* (2013.01); *H01L 2224/73265* (2013.01); *H01L 2225/1023* (2013.01); *H01L 2225/107* (2013.01); *H01L 2225/06506* (2013.01); *H01L 2225/06562* (2013.01)

USPC ........... 257/686; 257/311; 257/314; 257/315; 438/238; 438/241; 438/257; 438/262; 438/266

(58) Field of Classification Search
CPC ........... H01L 2924/00014; H01L 2224/48091; H01L 2225/06562
USPC ................. 257/296, 303, 311, 314, 315, 686; 438/238, 241, 257, 258, 262, 264, 266
See application file for complete search history.

(56) References Cited

U.S. PATENT DOCUMENTS

| | | |
|---|---|---|
| 4,404,655 A | 9/1983 | Naiff |
| 4,424,579 A | 1/1984 | Roesner |
| 4,598,386 A | 7/1986 | Roesner et al. |

(Continued)

OTHER PUBLICATIONS

Crowley et al. "612Mb PROM with 8 Layers of Antifuse/Diode Cells", 2003 International Solid-State Circuits Conference, Fig. 16.4.5.

(Continued)

*Primary Examiner* — Kyoung Lee
*Assistant Examiner* — Ratisha Mehta

(57) ABSTRACT

The present invention discloses a discrete three-dimensional memory (3D-M). It is partitioned into at least two discrete dice: a memory-array die and a peripheral-circuit die. The memory-array die comprises at least a 3D-M array, which is built in a 3-D space. The peripheral-circuit die comprises at least a peripheral-circuit component, which is built on a 2-D plane. At least one peripheral-circuit component of the 3D-M is formed in the peripheral-circuit die instead of in the memory-array die. The array efficiency of the memory-array die can be larger than 70%.

20 Claims, 8 Drawing Sheets

(56) References Cited

U.S. PATENT DOCUMENTS

| | | |
|---|---|---|
| 4,603,341 A | 7/1986 | Bertin et al. |
| 4,646,266 A | 2/1987 | Ovshinsky et al. |
| 4,796,074 A | 1/1989 | Roesner |
| 4,939,568 A | 7/1990 | Kato et al. |
| 5,257,224 A | 10/1993 | Nojiri et al. |
| 5,272,370 A | 12/1993 | French |
| 5,375,085 A | 12/1994 | Gnade et al. |
| 5,455,435 A | 10/1995 | Fu et al. |
| 5,468,983 A | 11/1995 | Hirase et al. |
| 5,721,169 A | 2/1998 | Lee |
| 5,751,012 A | 5/1998 | Wolstenholme et al. |
| 5,825,686 A | 10/1998 | Schmitt-Landsiedel et al. |
| 5,835,396 A | 11/1998 | Zhang |
| 5,838,530 A | 11/1998 | Zhang |
| 5,841,150 A | 11/1998 | Gonzalez et al. |
| 5,843,824 A | 12/1998 | Chou et al. |
| 5,847,442 A | 12/1998 | Mills, Jr. et al. |
| 5,854,111 A | 12/1998 | Wen |
| 5,904,526 A | 5/1999 | Wen et al. |
| 5,907,778 A | 5/1999 | Chou et al. |
| 5,943,255 A | 8/1999 | Kutter et al. |
| 6,015,738 A | 1/2000 | Levy et al. |
| 6,021,079 A | 2/2000 | Worley |
| 6,034,882 A | 3/2000 | Johnson et al. |
| 6,049,481 A | 4/2000 | Yamasaki |
| 6,055,180 A | 4/2000 | Gudesen et al. |
| 6,185,122 B1 | 2/2001 | Johnson et al. |
| 6,221,723 B1 | 4/2001 | Kunitou |
| 6,236,587 B1 | 5/2001 | Gudesen et al. |
| 6,380,597 B1 | 4/2002 | Gudesen et al. |
| 6,385,074 B1 | 5/2002 | Johnson et al. |
| 6,515,888 B2 | 2/2003 | Johnson et al. |
| 6,587,387 B1 | 7/2003 | Yeh et al. |
| 6,731,011 B2 | 5/2004 | Verma et al. |
| 6,773,937 B1 | 8/2004 | Ho et al. |
| 7,149,119 B2 | 12/2006 | Fasoli |
| 7,219,271 B2 | 5/2007 | Kleveland et al. |
| 7,383,476 B2 | 6/2008 | Crowley et al. |
| 7,675,802 B2 | 3/2010 | Kagan et al. |
| 7,696,812 B2 | 4/2010 | Al-Shamma et al. |
| 7,892,865 B2 | 2/2011 | Yano et al. |
| 7,952,904 B2 | 5/2011 | Zhang |
| 8,000,121 B2 | 8/2011 | Norman |
| 8,000,134 B2 | 8/2011 | Cornwell et al. |
| 8,141,021 B2 | 3/2012 | Norman |
| 8,208,297 B2 | 6/2012 | Norman |
| 8,223,525 B2 | 7/2012 | Balakrishnan et al. |
| 2002/0105091 A1* | 8/2002 | Ishii et al. ............ 257/777 |
| 2003/0067043 A1* | 4/2003 | Zhang ............ 257/390 |
| 2006/0192294 A1* | 8/2006 | Lee ............ 257/778 |
| 2008/0130342 A1* | 6/2008 | Zhang ............ 365/51 |
| 2008/0159722 A1* | 7/2008 | Zhang ............ 386/124 |
| 2009/0032949 A1* | 2/2009 | Goswami ............ 257/741 |
| 2009/0278591 A1* | 11/2009 | Pyeon et al. ............ 327/536 |
| 2010/0195421 A1† | 8/2010 | Jeddeloh |
| 2010/0208503 A1* | 8/2010 | Kuo ............ 365/51 |

OTHER PUBLICATIONS

Liu et al. "A 130.7mm2 2-Layer 32Gb ReRAM Memory Device in 24nm Technology", 2013 International Solid-State Circuits Conference, Fig. 12.1.7.

\* cited by examiner
† cited by third party

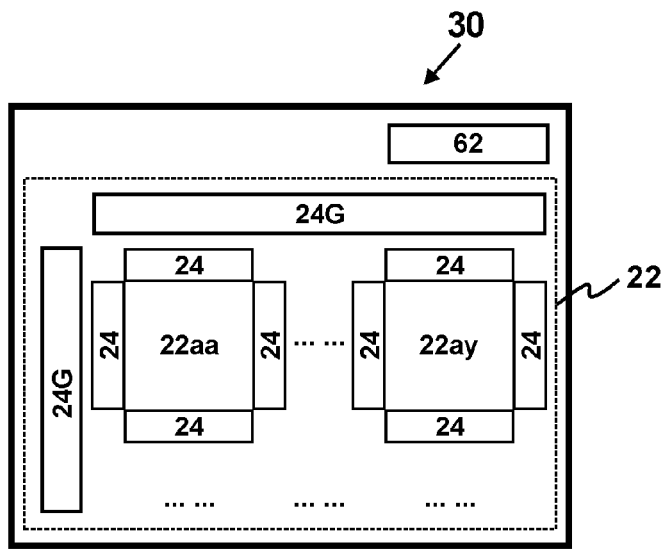
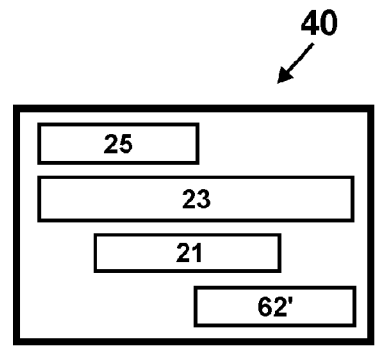
Fig. 8A  Fig. 8B
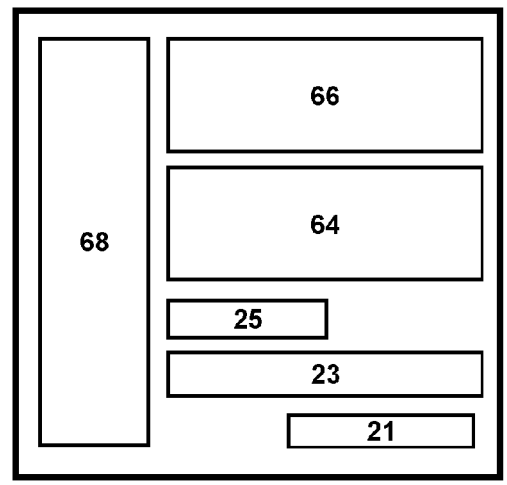
Fig. 9

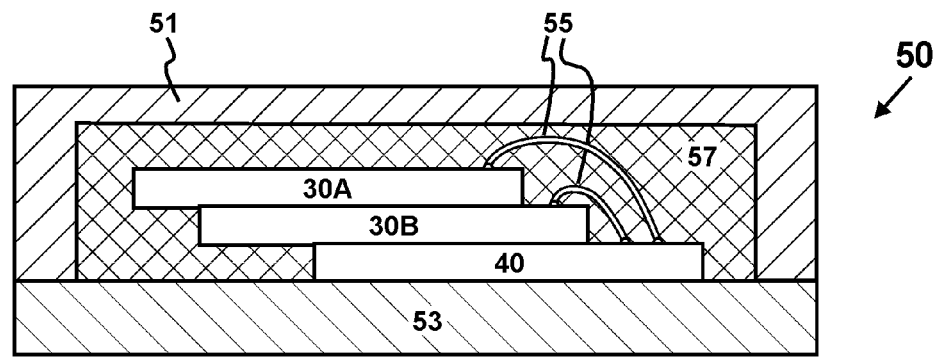
Fig. 10
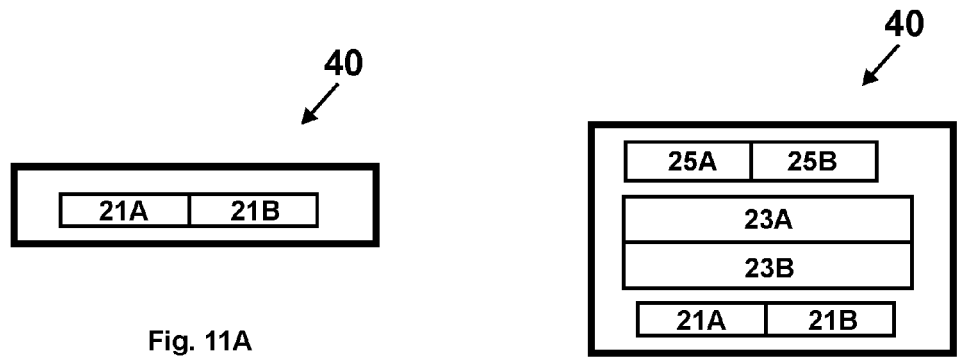
Fig. 11A
Fig. 11B
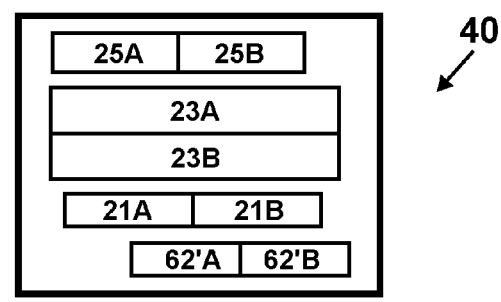
Fig. 11C

US 8,921,991 B2

DISCRETE THREE-DIMENSIONAL MEMORY

CROSS-REFERENCE TO RELATED APPLICATIONS

This application relates to a provisional application, "Three-Dimensional Memory with Separate Memory-Array and Peripheral-Circuit Substrates", Application Ser. No. 61/529,929, filed Sep. 1, 2011.

BACKGROUND

1. Technical Field of the Invention

The present invention relates to the field of integrated circuit, and more particularly to three-dimensional memory (3D-M).

2. Prior Arts

Three-dimensional memory (3D-M) is a semiconductor memory comprising a plurality of vertically stacked memory levels. It includes three-dimensional read-only memory (3D-ROM) and three-dimensional random-access memory (3D-RAM). The 3D-ROM can be further categorized into three-dimensional mask-programmed read-only memory (3D-MPROM) and three-dimensional electrically-programmable read-only memory (3D-EPROM). Based on programming mechanism, 3D-M may be categorized into memristor, resistive random-access memory (RRAM or ReRAM), phase-change memory, programmable metallization cell (PMC), and conductive-bridging random-access memory (CBRAM).

U.S. Pat. Nos. 5,835,396 and 6,717,222 disclose various 3D-Ms. As illustrated in FIG. 1, a 3D-M die 20 comprises a substrate level 0K and a plurality of vertically stacked memory levels 16A, 16B. The substrate level 0K comprises transistors 0t and interconnects 0i. Transistors 0t are formed in a semiconductor substrate 0, while interconnects 0i, including substrate metal layers 0M1, 0M2, are formed above the substrate 0 but below the lowest memory level 16A. Each of the memory levels (e.g. 16A) comprises a plurality of upper address lines (e.g. 2a), lower address lines (e.g. 1a) and memory cells (e.g. 5aa). The memory cells could use diodes, transistors or other devices. The memory levels (e.g. 16A) are coupled to the substrate 0 through contact vias (e.g. 1av). In this figure, the memory levels 16A, 16B form a plurality of 3D-M arrays 22, while the substrate level 0K comprises the peripheral circuits 28 for the 3D-M arrays 22. Generally speaking, the space 26 above the peripheral circuit 28 does not contain any memory cells. Since the 3D-M arrays 22 and their peripheral circuits 28 are integrated onto a same substrate 0, the 3D-M die 20 is referred to as an integrated 3D-M die.

FIG. 2 discloses more details on the memory-array region 22 and the peripheral-circuit region 28 in an integrated 3D-M die 20 (referring to Crowley et al. "512 Mb PROM with 8 layers of antifuse/diode cells", 2003 International Solid-State Circuits Conference, FIG. 16.4.5). The memory-array region 22 comprises a plurality of 3D-M arrays (e.g. 22aa, 22ay) and their decoders (e.g. 24, 24G). These decoders include local decoders 24 and global decoders 24G. The local decoder 24 decodes address/data for a single 3D-M array, while the global decoder 24G decodes the external address/data to each individual 3D-M array. On the other hand, the peripheral-circuit region 28 comprises all peripheral-circuit components for the 3D-M. The peripheral-circuit components include charge-pump circuit 21, page register 23 and trim-bit circuit 25. Here, the charge-pump circuit 21 generates the programming voltage and/or read voltage for the 3D-M; the page register 23 temporarily stores the data from a 3D-M page; the trim-bit circuit 25 records the faulty blocks in the 3D-M. Because the peripheral-circuit region 28 comprises all peripheral-circuit components and occupies a large die area, the array-efficiency of the integrated 3D-M die 20 is generally less than 70%.

It is a prevailing belief that integration will always reduce the manufacturing cost of the integrated circuit. This is not true for the 3D-M. Because the 3D-M arrays use a complex back-end process while their peripheral circuits use a relatively simple back-end process, integrating the 3D-M arrays with their peripheral circuits will force the peripheral circuits to use the expensive manufacturing process for the 3D-M arrays. As a result, integration does not reduce the manufacturing cost of the 3D-M, but actually increases it. In addition, because the peripheral circuits is constrained by the 3D-M arrays in the number of the substrate metal layers, the peripheral circuits are difficult to design and occupy a large die area. Furthermore, because the 3D-M cells generally require high-temperature processing, the peripheral circuits need to use high-temperature interconnect materials, e.g. tungsten (W). These materials degrade the overall 3D-M performance.

OBJECTS AND ADVANTAGES

It is a principle object of the present invention to provide a 3D-M with a lower cost.

It is a further object of the present invention to provide a 3D-M with an improved performance.

In accordance with these and other objects of the present invention, a discrete 3D-M is disclosed.

SUMMARY OF THE INVENTION

The present invention discloses a discrete 3D-M. It is partitioned into at least one memory-array die and a peripheral-circuit die. The memory-array die comprises a plurality of 3D-M arrays, each of which is built in a 3-D space and comprises a plurality of vertically stacked memory levels. The peripheral-circuit die comprises at least a peripheral-circuit component, which is built on a 2-D plane and comprises a single functional level. In other words, at least one peripheral-circuit component of the 3D-M is formed in the peripheral-circuit die instead of in the memory-array die. Because the memory-array die comprises fewer peripheral-circuit component(s), the array efficiency of the memory-array die can be larger than 70%.

The greatest advantage the discrete 3D-M offers is that, because the peripheral-circuit die can be manufactured using an independent and less expensive process, the overall cost of the discrete 3D-M is lower than that of the integrated 3D-M. In addition, because it is no longer constrained by the memory-array die in the number of substrate metal layers, the peripheral-circuit die can comprise more substrate metal layers. Accordingly, the peripheral-circuit components on the peripheral-circuit die are easier to design and occupy less die area. Furthermore, because the peripheral-circuit die does not require high-temperature processing, its interconnects may use high-speed interconnect materials, e.g. copper (Cu). This can improve the overall 3D-M performance.

BRIEF DESCRIPTION OF THE DRAWINGS

FIGS. 8A-8B disclose a third preferred partitioning scheme;

FIG. 9 discloses another preferred peripheral-circuit die;

FIG. 10 is a cross-sectional view of another preferred discrete 3D-M package;

FIGS. 11A-11D are top views of four preferred peripheral-circuit dice;

Figure 1:
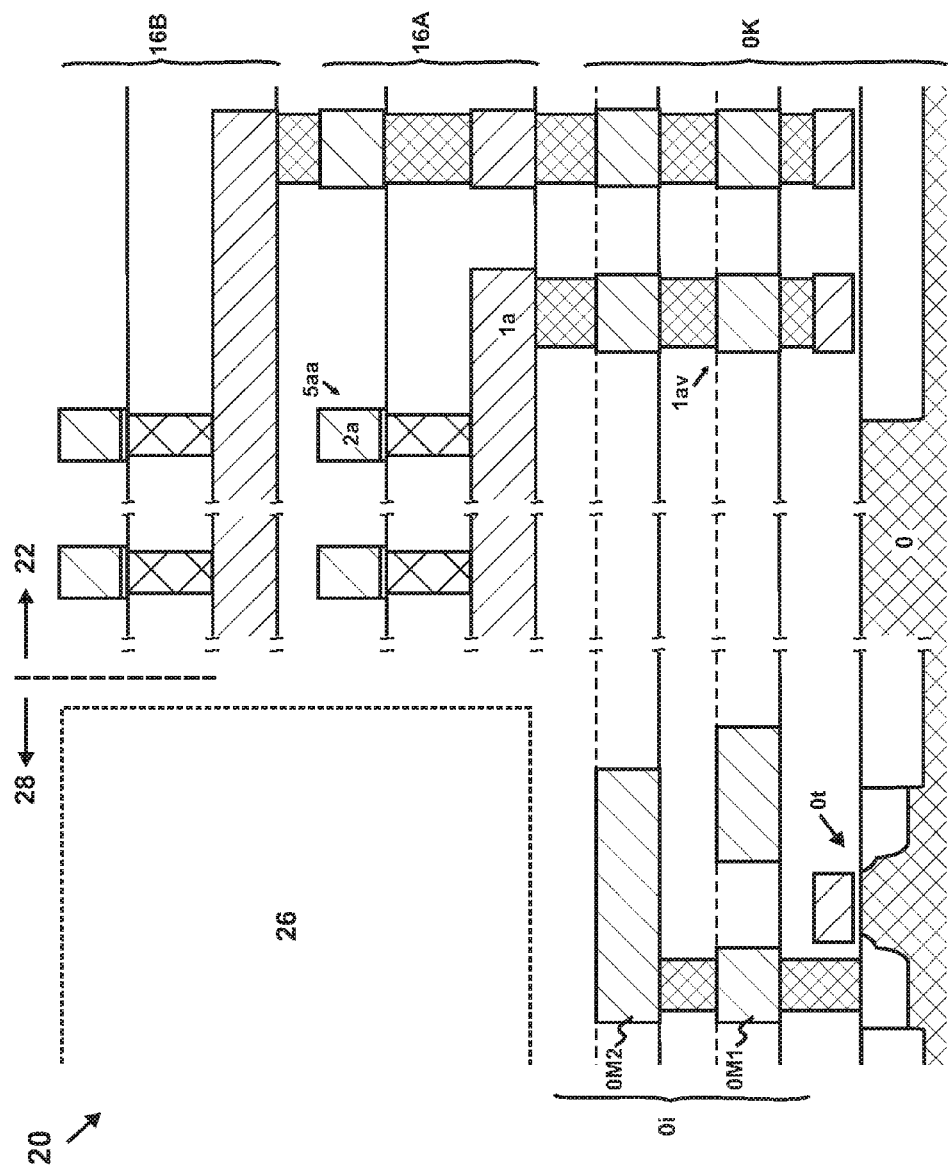
FIG. 1 is a cross-sectional view of an integrated 3D-M die from prior arts.
Figure 2:
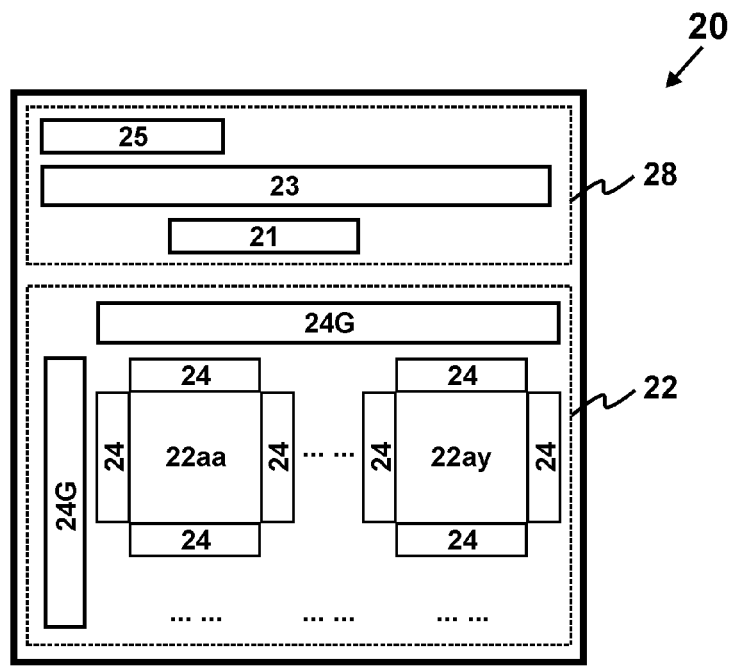
FIG. 2 is a top view of the integrated 3D-M die from prior arts.

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

Figure 3:
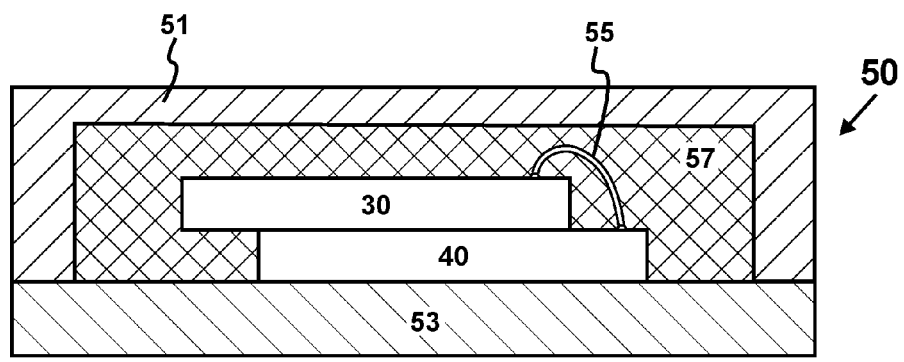
FIG. 3 is a cross-sectional view of a preferred discrete 3D-M package.

Referring now to FIG. 3, a preferred discrete 3D-M package 50 is disclosed. It comprises at least two discrete dice: a memory-array die 30 and a peripheral-circuit die 40. These dice 30, 40 are stacked on a package substrate 53 and located inside a package housing 51. Bond wires 55 provide electrical connection between the dice 30 and 40. Here, bond wire 55 is a coupling means between the memory-array die 30 and the peripheral-circuit die 40. Other coupling means include solder bump. To ensure data security, the dice 30, 40 are preferably encapsulated into a molding compound 57. In this preferred embodiment, the memory-array die 30 is vertically stacked above the peripheral-circuit die 40. Alternatively, the memory-array die 30 can be stacked face-to-face towards the peripheral-circuit die 40, or, the memory-array die 30 can be mounted side-by-side with the peripheral-circuit die 40.

Figure 4:
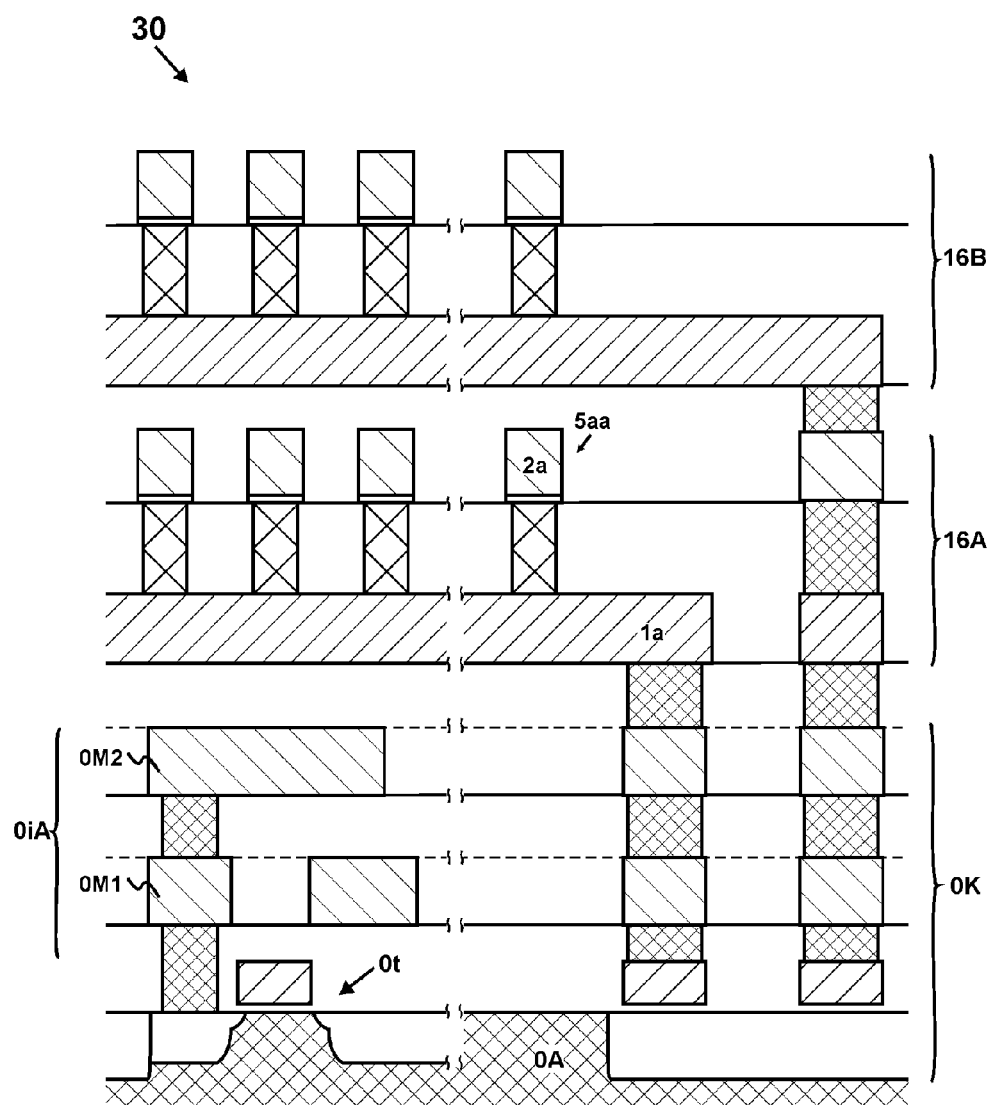
FIG. 4 is a cross-sectional view of a preferred memory-array die.

FIG. 4 is a cross-sectional view of the preferred memory-array die 30. It is built in a 3-D space and comprises multiple functional levels, i.e. substrate level 0K and memory levels 16A, 16B. The memory-array die 30 is formed on a memory-array substrate 0A. The substrate level 0K comprises transistors 0t and interconnects 0iA, which includes two substrate metal layers 0M1, 0M2. To accommodate the high-temperature process for the memory cells (e.g. 5aa), the substrate metal layers 0M1, 0M2 preferably comprise high-temperature interconnect materials, e.g. tungsten (W). The memory levels 16A, 16B and their substrate metal layers are similar to those in the integrated 3D-M die 20 of FIG. 1.

Figure 5:
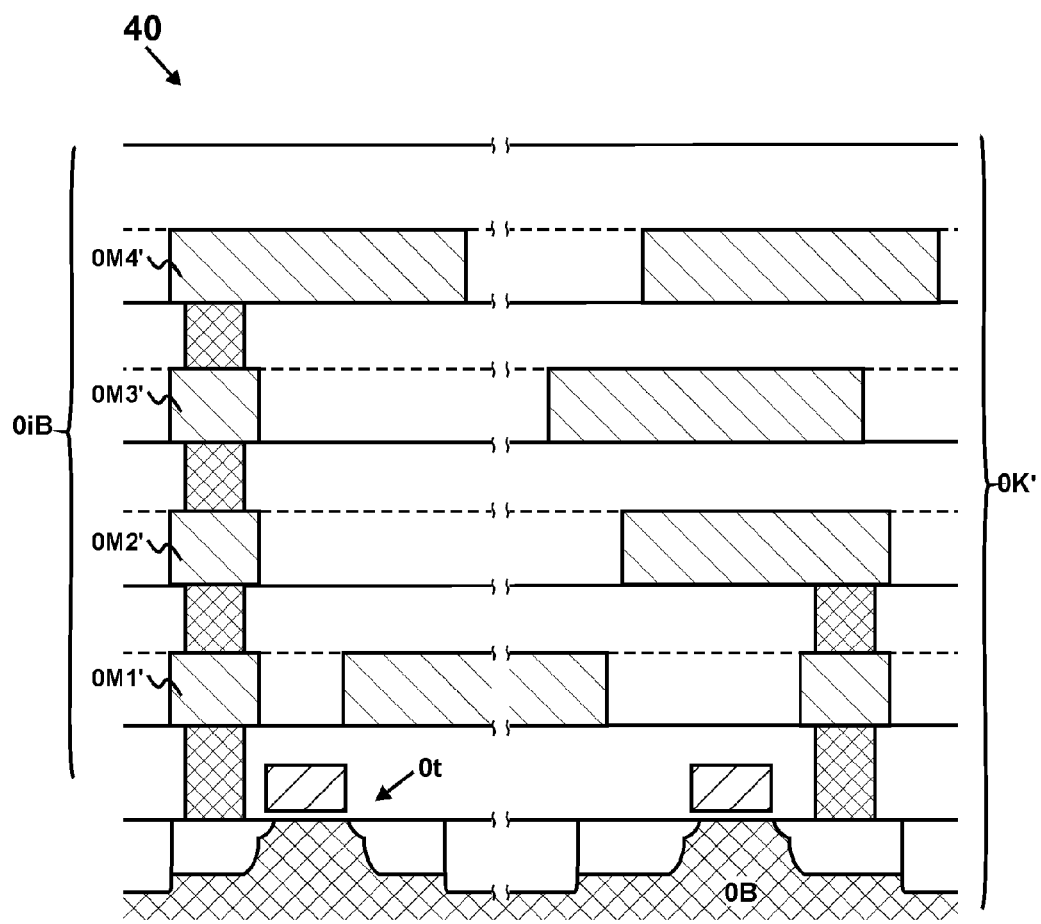
FIG. 5 is a cross-sectional view of a preferred peripheral-circuit die.

FIG. 5 is a cross-sectional view of the preferred peripheral-circuit die 40. It is built on a 2-D plane and comprises a single functional level, i.e. the substrate level 0K'. The peripheral-circuit die 40 is formed on a peripheral-circuit substrate 0B. The substrate level 0K' comprises transistors 0t and interconnects 0iB, which includes four substrate metal layers 0M1'-0M4'. Note that, because it is no longer constrained by the memory-array die in the number of substrate metal layers, the peripheral-circuit die can comprise more substrate metal layers (4 vs. 2). Accordingly, the peripheral-circuit components on the peripheral-circuit die 40 are easier to design and occupy less die area than those on the integrated 3D-M die 20. Furthermore, because the peripheral-circuit die 40 does not require high-temperature processing, its interconnects 0iB may use high-speed interconnect materials, e.g. copper (Cu). This can improve the performance of the peripheral-circuit die 40, as well as the overall performance of the 3D-M.

By partitioning the peripheral-circuit components between the memory-array die 30 and the peripheral-circuit die 40, the size of the memory-array die 30 can be reduced. Using discrete 3D-M, the array efficiency of the memory-array die 30 can be larger than 70%. Hereinafter, the array efficiency is the ratio of the effective die area, i.e. the die area under at least one memory array, and the whole die area.

Figures 6A, 6B:
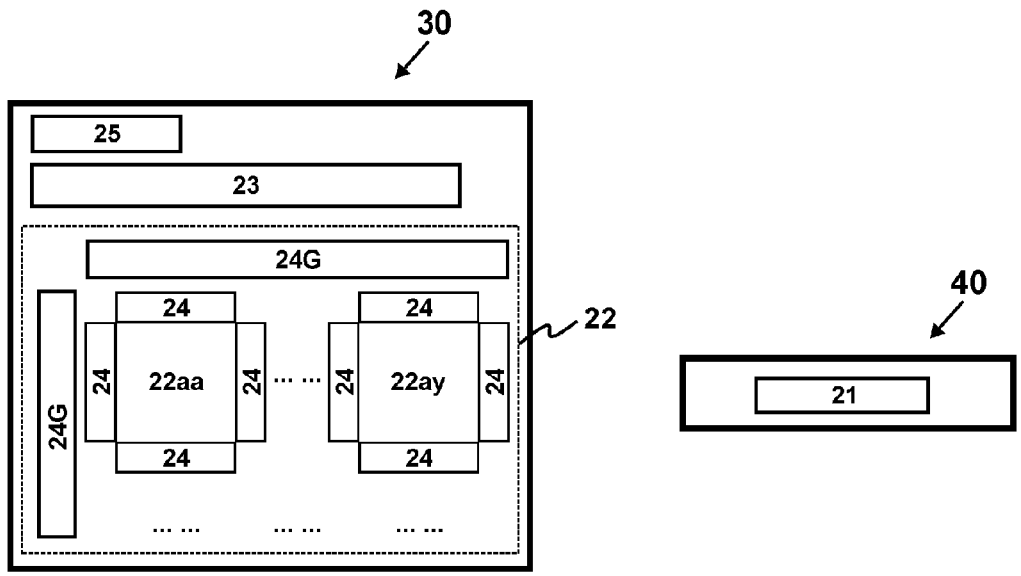
FIGS. 6A-6B disclose a first preferred partitioning scheme.

FIGS. 6A-6B disclose the first preferred partitioning scheme. In FIG. 6A, the memory-array die 30 comprises a plurality of 3D-M arrays (e.g. 22aa, 22ay) and decoders. It also comprises peripheral-circuit components such as the page register 23 and the trim-bit circuit 25. However, it does not comprise at least a peripheral-circuit component, e.g. the charge-pump circuit 21. In FIG. 6B, the peripheral-circuit die 40 comprises the peripheral-circuit component(s) that is (are) absent in the memory-array die 30 of FIG. 6A, i.e. a charge-pump circuit 21.

Figures 7A, 7B:
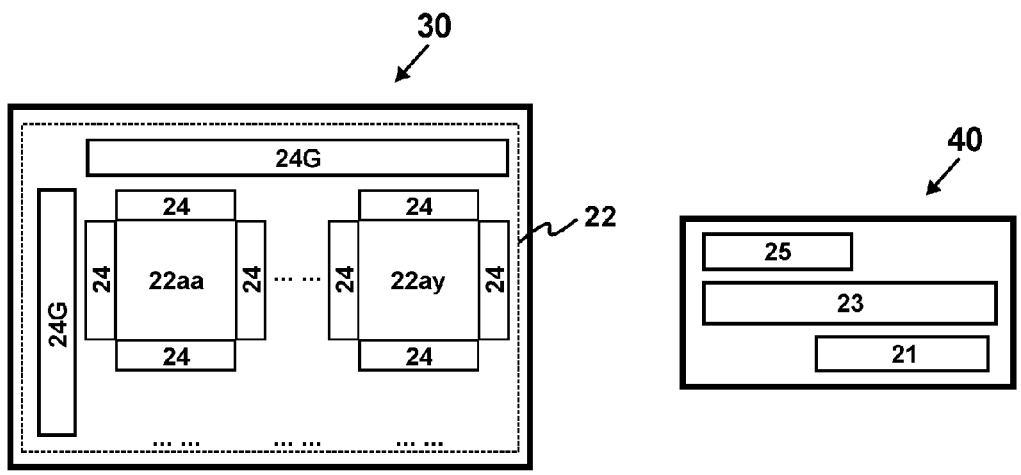
FIGS. 7A-7B disclose a second preferred partitioning scheme.
Figure 11D:
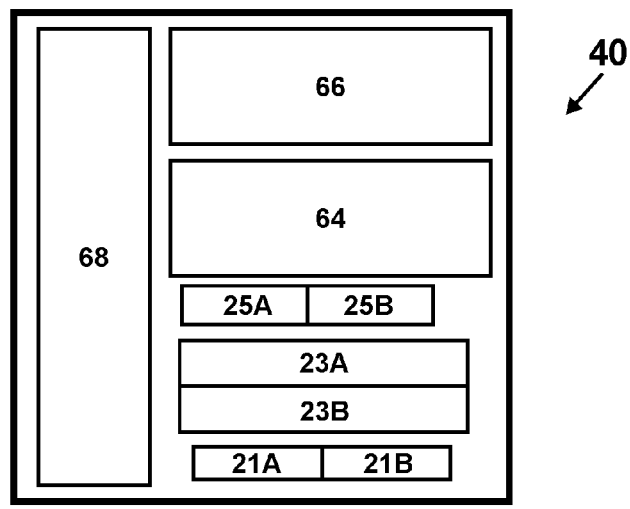

FIGS. 7A-7B disclose the second preferred partitioning scheme. In FIG. 7A, the memory-array die 30 comprises only the 3D-M arrays (e.g. 22aa, 22ay) and their decoders. In FIG. 7B, the peripheral-circuit die 40 comprises all peripheral-circuit components, including the charge-pump circuit 21, the page register 23, and the trim-bit circuit 25.

FIGS. 8A-8B disclose the third partitioning scheme. It is similar to those in FIGS. 7A-7B except that the memory-array die 30 further comprises a first parallel-serial converting circuit 62. It converts the internal parallel digital signals (e.g. address/data/instruction) inside the memory-array die 30 to the serial digital signals outside the memory-array die 30. The peripheral-circuit die 40 further comprise a second parallel-serial converting circuits 62'. It converts the internal parallel digital signals (e.g. address/data/instruction) inside the peripheral-circuit die 40 to the serial digital signals outside the peripheral-circuit die 40. By converting digital signals from parallel to serial, the number of bond wires (or, solder bumps) can be significantly reduced between the memory-array die 30 and the peripheral-circuit die 40. As a result, the extra bonding cost due to partitioning can be minimized.

FIG. 9 illustrates another preferred peripheral-circuit die 40. Besides the peripheral-circuit components (e.g. charge-pump circuit 21, the page register 23 and the trim-bit circuit 25), it further comprises a controller block 64, a RAM block 66 and/or a ROM block 68. The controller block 64 controls read, programming, error-correction/detection of the 3D-M. The RAM block 66 could comprise SRAM or DRAM. It functions as a cache for the 3D-M. The ROM block 68 could comprise flash memory, EERPOM, EPROM, or one-time-programmable memory (OTP). It functions as redundancy for the 3D-M.

Because the memory-array die 30 and the peripheral-circuit die 40 are two independent dice, the peripheral-circuit die 40 can be manufactured using an independent and less expensive process, not the expensive process for the memory-array die 30. As a result, the wafer cost for the peripheral-circuit die 40 is far less than the memory-array die 30. Hence, the overall cost of the discrete 3D-M package 50 is lower than that of the integrated 3D-M die 20.

Referring now to FIG. 10, another preferred discrete 3D-M package 50 is disclosed. It comprises at least two memory-array dice 30A, 30B and a peripheral-circuit die 40. These dice 30A, 30B, 40 are three discrete dice. They are located inside a package housing 51. The memory-array die 30A is vertically stacked on the memory-array die 30B, and the memory-array die 30B is vertically stacked on the peripheral-circuit die 40. Bond wires 55 provide electrical connections between the dice 30A, 30B, and 40.

To lower the overall cost, the peripheral-circuit die 40 is shared by both memory-array dice 30A, 30B. FIGS. 11A-11D disclose several peripheral-circuit die 40 used in the preferred discrete 3D-M package 50 of FIG. 10. The peripheral-circuit die 40 of FIG. 11A serves the memory-array dice 30A, 30B, which are similar to that of FIG. 6A. It comprises two charge-pump circuits 21A, 21B for the dice 30A, 30B, respectively. The peripheral-circuit die 40 of FIG. 11B serves the memory-array dice 30A, 30B, which are similar to that of FIG. 7A. It comprises two charge-pump circuits 21A, 21B; two page registers 23A, 23B; and two trim-bit circuits 25A, 25B; for the dice 30A, 30B, respectively. The peripheral-circuit die 40 of FIG. 11C serves the memory-array dice 30A, 30B, which are similar to that of FIG. 8A. It further comprises two parallel-serial converting circuits 62'A, 62'B for the dice 30A, 30B, respectively. The peripheral-circuit die 40 of FIG. 11D serves the memory-array dice 30A, 30B, which are similar to that of FIG. 9. It further comprises a controller block 64, a RAM block 66 and/or a ROM block 68. All of these blocks are shared by both memory-array dice 30A, 30B.

Figure 12:
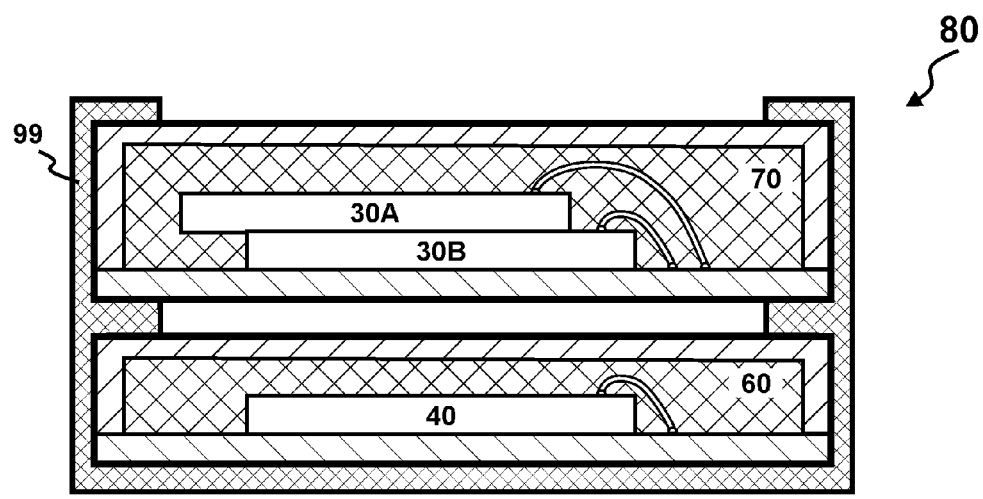
FIG. 12 is a cross-sectional view of a preferred discrete 3D-M module.

Besides discrete 3D-M package, the inventive concepts disclosed in the present invention can be easily extended to discrete 3D-M module. FIG. 12 discloses a preferred discrete 3D-M module 80. It comprises a module frame 99, which comprises two discrete packages, i.e. a memory-array package 70 and a peripheral-circuit package 60. The memory-array package 70 further compromises two memory-array dice 30A, 30B, while the peripheral-circuit package 60 further comprises a peripheral-circuit die 40. The module frame 99 provides electrical connections between the memory-array package 70 and the peripheral-circuit package 60 (not drawn in this figure). All descriptions about the discrete 3D-M package 50 in FIGS. 4-11D of the present invention can be applied to the discrete 3D-M module 80.

While illustrative embodiments have been shown and described, it would be apparent to those skilled in the art that may more modifications than that have been mentioned above are possible without departing from the inventive concepts set forth therein. The invention, therefore, is not to be limited except in the spirit of the appended claims.

What is claimed is:

1. A discrete three-dimensional memory (3D-M), comprising:
   a memory-array die comprising a plurality of 3D-M arrays, each of said 3D-M arrays comprising a plurality of vertically stacked memory cells;
   a peripheral-circuit die comprising at least a peripheral-circuit component for said memory-array die, wherein said peripheral-circuit component is selected from a group consisting of a charge-pump circuit, a page register and a trim-bit circuit; and wherein said peripheral-circuit component is absent from said memory-array die;
   means for coupling said memory-array die and said peripheral-circuit die;
   wherein said peripheral-circuit die comprises fewer back-end layers than said memory-array die; and wherein said memory-array die and said peripheral-circuit die are two discrete dice.

2. The memory according to claim 1, wherein said 3D-M comprises a three-dimensional read-only memory (3D-ROM) or a three-dimensional random-access memory (3D-RAM).

3. The memory according to claim 2, wherein said 3D-ROM is a three-dimensional mask-programmed read-only memory (3D-MPROM), or a three-dimensional electrically-programmable read-only memory (3D-EPROM).

4. The memory according to claim 1, wherein said 3D-M comprises a memristor, resistive random-access memory (RRAM or ReRAM), phase-change memory, programmable metallization cell (PMC), or conductive-bridging random-access memory (CBRAM).

5. The memory according to claim 1, wherein said memory-array and peripheral-circuit dice are located in a memory package or a memory module.

6. The memory according to claim 1, wherein at least one of said memory-array die and said peripheral-circuit die further comprises a parallel-serial converting means.

7. The memory according to claim 1, further comprising another memory-array die including at least another 3D-M array, wherein said peripheral-circuit die further comprises at least another peripheral-circuit component for said another memory-array die.

8. The memory according to claim 1, wherein said peripheral-circuit die comprises different interconnect materials than said memory-array die.

9. The memory according to claim 8, wherein the interconnect materials of said memory-array die are stable at a higher processing temperature than the interconnect materials of said peripheral-circuit die.

10. The memory according to claim 8, wherein at least an interconnect material of said peripheral-circuit die has a higher electrical conductivity than at least another interconnect material of said memory-array die.

11. A discrete three-dimensional memory (3D-M), comprising:
    a memory-array die comprising a plurality of 3D-M arrays, each of said 3D-M arrays comprising a plurality of vertically stacked memory cells;
    a peripheral-circuit die comprising at least a peripheral-circuit component for said memory-array die, wherein said peripheral-circuit component is selected from a group consisting of a charge-pump circuit, a page register and a trim-bit circuit; and wherein said peripheral-circuit component is absent from said memory-array die;
    means for coupling said memory-array die and said peripheral-circuit die;
    wherein said peripheral-circuit die comprises different interconnect materials than said memory-array die; and wherein said memory-array die and said peripheral-circuit die are two discrete dice.

12. The memory according to claim 11, wherein the interconnect materials of said memory-array die are stable at a higher processing temperature than the interconnect materials of said peripheral-circuit die.

13. The memory according to claim 11, wherein at least an interconnect material of said peripheral-circuit die has a higher electrical conductivity than at least another interconnect material of said memory-array die.

14. The memory according to claim 11, wherein said peripheral-circuit die comprises fewer back-end layers than said memory-array die.

15. The memory according to claim 11, wherein said 3D-M comprises a three-dimensional read-only memory (3D-ROM) or a three-dimensional random-access memory (3D-RAM).

16. The memory according to claim 15, wherein said 3D-ROM is a three-dimensional mask-programmed read-only memory (3D-MPROM), or a three-dimensional electrically-programmable read-only memory (3D-EPROM).

17. The memory according to claim 11, wherein said 3D-M comprises a memristor, resistive random-access memory (RRAM or ReRAM), phase-change memory, programmable metallization cell (PMC), or conductive-bridging random-access memory (CBRAM).

18. The memory according to claim 11, wherein said memory-array and peripheral-circuit dice are located in a memory package or a memory module.

19. The memory according to claim 11, wherein at least one of said memory-array die and said peripheral-circuit die further comprises a parallel-serial converting means.

20. The memory according to claim 11, further comprising another memory-array die including at least another 3D-M array, wherein said peripheral-circuit die further comprises at least another peripheral-circuit component for said another memory-array die.

\* \* \* \* \*